(12) United States Patent
Chandler

(10) Patent No.: US 6,831,225 B2
(45) Date of Patent: Dec. 14, 2004

(54) METHOD AND ARRANGEMENT FOR PROVIDING ELECTRICAL POWER TO AN ELECTRONIC EQUIPMENT CABINET

(75) Inventor: Gary C. Chandler, San Juan Capistrano, CA (US)

(73) Assignee: Prima Corporation, Arlington, VT (US)

( * ) Notice: Subject to any disclaimer, the term of this patent is extended or adjusted under 35 U.S.C. 154(b) by 0 days.

(21) Appl. No.: 10/145,082

(22) Filed: May 14, 2002

(65) Prior Publication Data

US 2002/0172012 A1 Nov. 21, 2002

Related U.S. Application Data

(60) Provisional application No. 60/291,117, filed on May 15, 2001.

(51) Int. Cl.[7] .................................................. H02G 3/08
(52) U.S. Cl. ........................ 174/50; 174/59; 174/135; 361/600; 361/601
(58) Field of Search ..................... 174/50, 60, 48, 174/135, 65 R, 50.51, 59; 211/26; 220/3.2, 3.3, 4.02; 312/223.6, 243, 826, 223.1, 265.1, 265.4; 361/724, 600, 625, 614, 730, 752, 796, 797, 826

(56) References Cited

U.S. PATENT DOCUMENTS

| | | | | |
|---|---|---|---|---|
| 4,680,425 A | * | 7/1987 | Speraw ........................ 174/50 |
| 5,165,770 A | * | 11/1992 | Hahn ........................... 211/26 |
| 5,286,919 A | * | 2/1994 | Benson et al. ................. 174/50 |
| 5,695,263 A | * | 12/1997 | Simon et al. ............. 312/265.4 |
| 5,773,757 A | * | 6/1998 | Kenney et al. ................. 174/53 |
| 5,894,106 A | * | 4/1999 | Schwenk et al. .............. 174/50 |
| 5,982,610 A | | 11/1999 | Crawford et al. ............ 361/641 |
| 5,997,117 A | | 12/1999 | Krietzman ................ 312/265.4 |
| 6,015,197 A | * | 1/2000 | DiGiacomo et al. ...... 312/223.6 |
| 6,067,233 A | * | 5/2000 | English et al. ............... 361/724 |
| 6,293,637 B1 | | 9/2001 | Anderson et al. ......... 312/265.1 |
| 6,301,095 B1 | * | 10/2001 | Laughlin et al. ............... 174/59 |
| 6,307,750 B1 | * | 10/2001 | Bendikas et al. ............ 361/724 |
| 6,310,783 B1 | * | 10/2001 | Winch et al. ................. 361/724 |
| 6,348,655 B1 | * | 2/2002 | Wright ......................... 174/50 |
| 6,359,217 B1 | * | 3/2002 | Thompson et al. ............ 174/50 |
| 6,369,321 B1 | * | 4/2002 | Flegel ........................... 174/50 |
| 6,396,990 B1 | * | 5/2002 | Ehn et al. ................. 174/50.51 |
| 6,657,123 B2 | * | 12/2003 | Moore .......................... 174/50 |

FOREIGN PATENT DOCUMENTS

| | | |
|---|---|---|
| CN | 345368 | 11/1998 |
| CN | 380751 | 1/2000 |

* cited by examiner

*Primary Examiner*—Dean A. Reichard
*Assistant Examiner*—Angel R. Estrada
(74) *Attorney, Agent, or Firm*—John Pietrangelo; Heslin Rotheberg Farley & Mesiti P.C.

(57) ABSTRACT

A cabinet for mounting electronic equipment having power input port mounted external to the frame of the cabinet in order to make installation of a power input unit more convenient. The power input port may be mounted on the bottom of the cabinet whereby the power input unit, for example, a power distribution unit, may be installed prior to, during, or after installation of the cabinet. In addition, among other things, the mounting of a power input unit outside the frame of the cabinet provides for improved accessability and servicing of the power input unit and provides for more usable space inside the cabinet frame.

9 Claims, 10 Drawing Sheets

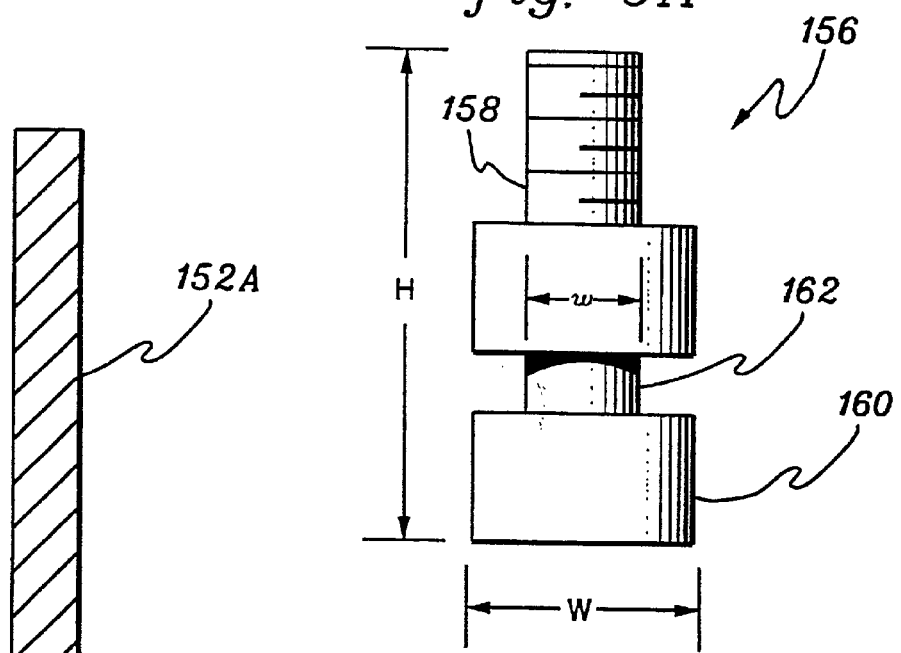
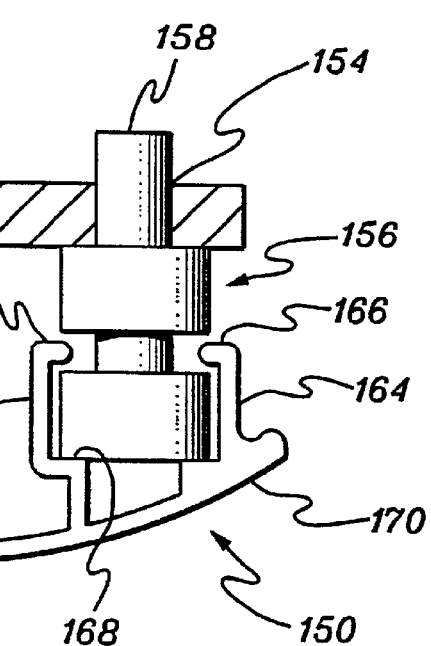

METHOD AND ARRANGEMENT FOR PROVIDING ELECTRICAL POWER TO AN ELECTRONIC EQUIPMENT CABINET

CROSS-REFERENCE TO RELATED APPLICATIONS

This application claims the benefit of U.S. Provisional Application No. 60/291,117, entitled "Electronic Instrument Mounting Rack" filed May 15, 2001, the disclosure of which is incorporated by reference herein in its entirety.

This application contains subject matter which is related to the subject matter of the following applications, which is assigned to the same assignee as this application and was filed on the same day as this application. The below-listed applications are hereby incorporated by reference in their entirety:

"Method of Attaching Supports to an Electronic Equipment Cabinet", U.S. Ser. No. 10/145,844.

"Support Member Having a Recess for Routing Cables and Method of Routing Cables in an Electronic Equipment Cabinet", U.S. Ser. No. 10/145,157.

"A Trim Piece, a Trim Piece Mounting Arrangement and a Method of Mounting a Trim Piece for an Electronic Equipment Cabinet", U.S. Ser. No. 10/145,846.

TECHNICAL FIELD

This invention relates generally to apparatus and methods used for mounting electronic equipment. Specifically, the present invention provides improved methods and apparatus for mounting electronic equipment in a cabinet, supplying power to the equipment, and supporting the housing, and routing electrical conduit within the housing.

BACKGROUND OF THE INVENTION

In the electronics industry, electronic equipment is typically mounted in enclosures or cabinets to facilitate installation, interfacing with related equipment, and to facilitate access by technicians for servicing and repair. One recognized standard enclosure used by electronic equipment manufacturers is the 19-inch standard for mounting electronic equipment or sub chassis into an enclosure. The 19-inch enclosure standard is defined by the Electronics Industries Association standard EIA310. The EIA310 standard, which is incorporated by reference herein, defines the specifications for the mounting of 19-inch panels and equipment. In compliance with this standard, electronic equipment manufacturers provide products, for example, computers or computer peripheral equipment, that are mountable or installable into 19-inch enclosures, cabinets, or racks, as they are referred to in the art.

Conventional electronic equipment racks include some form of frame or support structure upon which the equipment is mounted, typically by mechanical fasteners. This frame provides the structural support of the equipment while providing access to electrical conduit, that is, wires and cables, for power and data transfer. Panels, typically sheet metal or plastic are typically mounted to the frame to protect the equipment and to provide an aesthetically pleasing appearance to the cabinet.

Conventional cabinets or racks typically include some form of casters mounted on the bottom of the cabinet for facilitating installation, removal, and servicing of the equipment mounted in the rack. Conventional cabinets may also include some form of seismic support for preventing vibration damage to the equipment or toppling of the cabinets during an earthquake. In conventional equipment racks, casters and seismic supports are typically mounted to a sheet metal plate secured to the bottom of the cabinet. However, the mounting of the casters and seismic supports to the thin sheet metal of the cabinet is somewhat prone to damaging the sheet metal or failure of the caster or support during transport, handling, or vibration loading (for example, an earthquake). There is a need in the art to provide improved structural stiffness and strength to the mounting of casters and seismic supports to cabinets holding electronic equipment.

As would be expected, electronic equipment cabinets typically also contain numerous electrical conduits, that is, wires and cables, for power and data transfer. However, depending upon the equipment in the cabinet the number of conduits may be quite numerous and unwieldy. The presence of many exposed conduits, even when properly secured, can interfere with the installation and servicing of the cabinet as well as be prone to damage during installation and servicing. There is a need in the art to provide electronic equipment cabinets in which such cabling can be secured and possibly hidden to facilitate installation and servicing.

One electronic component that is typically installed in conventional electronic equipment cabinets is a power input unit, that is, the unit or component that receives electric power from an external source, such as a power outlet, and through which power is provided to the equipment in the cabinet. The power input unit may include some form of power conditioning if necessary. In conventional electronic equipment cabinets, the power input unit is typically located within the cabinet, that is, behind a panel or sheet metal barrier and thus not readily accessible to the operator or technician. Thus, in order to access the power input unit, a panel or barrier must be removed. This can be inconvenient when attempting to install, service, or simply access the power input unit. In addition, locating the power input unit within the envelope of the cabinet can consume valuable space within the cabinet that could be used for other equipment. There is also a need in the art to facilitate access to the power input unit of an electronic equipment cabinet, or to more advantageously use the space within the equipment cabinet.

These and other deficiencies of the prior art equipment cabinets are addressed by the present invention.

SUMMARY OF THE INVENTION

The present invention provides methods and apparatus which address many of the limitations of prior art methods and apparatus. One aspect of the invention is a cabinet for mounting electronic equipment comprising a rectangular cylindrical frame having a top, a bottom, and sides, and means for supporting the cabinet, the frame comprising vertical support members and horizontal support members, wherein the means for supporting the cabinet are mounted to at least one of the horizontal support members.

In one aspect of the invention, the at least one of the horizontal support members is located adjacent the bottom of the cabinet and the means for supporting the cabinet are mounted to at least one of the horizontal support members located adjacent the bottom of the housing. In another aspect of the invention, the means for supporting the cabinet comprises one at least one caster, at least one seismic support, or a combination of at least one caster and at least one seismic support. In one aspect of the invention, the means for supporting the cabinet comprises a plurality of casters or a plurality of seismic supports.

Another aspect of the invention is a cabinet for mounting electronic equipment comprising a rectangular cylindrical frame having a top, a bottom, sides, and casters for supporting the housing, the frame comprising vertical support members and horizontal support members, wherein the casters are mounted directly to at least one of the horizontal support members. The casters are typically mounted to one of the horizontal support members located at the bottom of the housing.

Another aspect of the present invention is a cabinet for mounting electronic equipment comprising a rectangular cylindrical frame having a top, a bottom, sides, and at least one seismic support for supporting the housing and minimizing the vibration load on the equipment, the frame comprising vertical support members and horizontal support members, wherein the at least one seismic support is mounted directly to at least one of the horizontal support members. Typically, the at least one seismic support is mounted to one of the horizontal support members located at the bottom of the housing.

Another aspect of the invention is a method for supporting an electronic equipment cabinet, the cabinet having a frame comprising at least one horizontal member, the method comprising: providing means for supporting the cabinet; and mounting the means for supporting the cabinet to the at least one horizontal member of the frame. In one aspect of this invention, providing means for supporting the cabinet comprises providing at least one of at least one caster and at least one seismic support. In another aspect of this invention, the electronic equipment cabinet has a top and a bottom and the frame comprises at least one horizontal member positioned adjacent the bottom of the cabinet, wherein mounting the means for supporting the cabinet comprises mounting the means for supporting the cabinet to the at least one horizontal member positioned adjacent the bottom of the cabinet.

A further aspect of the invention is a supporting arrangement for an electronic equipment cabinet, the cabinet comprising a cylindrical frame having a top and a bottom, at least one panel mounted to the frame, and at least one leveling device, the frame comprising vertical support members and horizontal support members, wherein the support arrangement comprises a supporting element mounted to a horizontal support member positioned adjacent the bottom of the frame. In one aspect of the invention, the supporting element comprises at least one caster. In another aspect of the invention, the supporting element comprises at least one seismic support. In one aspect of the invention, the frame comprises at least one L-shaped support member having a horizontal leg and a vertical leg. In another aspect of the invention, the supporting element comprises at least one caster or at least one seismic support mounted to the horizontal leg of the L-shaped support member.

Another aspect of the invention is a cabinet for mounting electronic equipment comprising a rectangular cylindrical frame having a top, bottom, and sides, the frame comprising vertical support members and horizontal support members, wherein at least one of the support members comprises at least one recess for installing electrical conduit, for example, electrical wires and electrical cables and the like. In one aspect of the invention, the at least one recess in the at least one support member comprises a longitudinal recess. In another aspect of the invention, the vertical support members comprise at least one vertical support member having a first recess and the horizontal support members comprise at least one horizontal support member having a second recess, wherein the first and second recesses communicate with each other. In another aspect of the invention, the frame further comprises at least one support member connecting element and wherein the first and second recesses communicate with each other via the at least one support member connecting element.

Another aspect of the invention is a method for routing at least one electrical conduit in an electronic equipment cabinet, the cabinet comprising a frame comprising at least one horizontal or vertical member having a longitudinal recess, the method comprising routing the at least one cable in the longitudinal recess. In one aspect of the invention, the frame comprises at least one horizontal member having a longitudinal recess and at least one vertical member having a longitudinal recess, and the method comprises routing the at least one cable through the longitudinal recess of the at least one horizontal member and through the longitudinal recess of the at least one vertical member. In another aspect of the invention, the frame further comprises at least one connecting element between the at least one horizontal member and the at least one vertical member, the at least one connecting element having a recess, and wherein the method comprises routing the at least one cable through the longitudinal recess of the at least one horizontal member, through the recess of the at least one connecting element, and through the longitudinal recess of the at least one vertical member.

Another aspect of the invention is a cabinet for mounting electronic equipment comprising a rectangular cylindrical frame having a top, bottom, and sides, the frame defining an internal cavity, and at least one power input unit for supplying power to at least some of the electronic equipment, wherein the at least one power input unit is mounted outside of the internal cavity. In one aspect of the invention, the at least one power input unit is mounted below the bottom of the frame.

Another aspect of the invention is a method of providing at least one power input unit to an electronic equipment cabinet, the cabinet comprising a support frame and the support frame defining an internal cavity of the electronic equipment cabinet, the method comprising: providing a power input unit; providing a power input unit interface for the electronic equipment cabinet positioned outside the internal cavity of the electronic equipment cabinet; and installing the power input unit in the power input unit interface. In one aspect of the invention, the electronic equipment cabinet further comprises at least one panel mounted to the frame, and wherein installing the power input unit comprises installing the power input unit without removing any panels from the electronic equipment cabinet. In another aspect of the invention, the support frame has a top and a bottom, wherein providing a power input unit interface comprises providing a power input unit interface below the bottom of the frame.

A further aspect of the invention is a trim piece mounting for an electronic equipment cabinet, the cabinet comprising a frame having at least one mounting surface, the trim piece mounting comprising: an elongated member having an inner surface and an outer surface; and means for attaching the elongated member to the mounting surface of the frame. In one aspect of the invention, the mounting surface of the frame comprises a perforated mounting surface and wherein the means of attaching the elongated member to the mounting surface comprises at least one projection located on the inner surface of the elongated member. In another aspect of the invention, the means for attaching the elongated member comprises at least one spacerthe at least one spacer comprising means for attaching the at least one spacer to the mounting surface of the frame and means for attaching the elongated member to the at least one spacer. In another aspect of the invention, the mounting surface on the frame comprises a plurality of threaded holes and the means for attaching the at least one spacer to the mounting surface comprises a threaded projection on the at least one spacer.

A still further aspect of the invention is a method of mounting a trim piece to an electronic equipment cabinet having a mounting surface, the method comprising: providing at least one spacer having a main body portion and a recess positioned in the main body portion; providing a trim piece having at least one extension engagable with the recess; mounting the at least one spacer to the mounting surface of the cabinet; and attaching the trim piece to the at least one spacer wherein the at least one extension engages the recess in the spacer. In one aspect of the invention, the mounting surface comprises a plurality of perforations, wherein mounting the at least one spacer to the mounting surface comprises engaging the at least one spacer with the plurality of perforations. In another aspect of the invention, the plurality of perforations comprises a plurality of threaded perforations and the at least one spacer comprises at least one threaded end, wherein mounting the at least one spacer to the mounting surface comprises threading the at least one threaded end of the spacer into the plurality of threaded perforations.

An even further aspect of the invention is a trim piece attachable to a mounting surface of an electronic equipment cabinet, the trim piece comprising: an elongated flexible member having an inner surface and an outer surface; and at least one extension on the inner surface for attaching the elongated flexible member to the mounting surface of the frame. In one aspect of the invention, the at least one extension comprises at least two elongated flexible extensions. In another aspect of the invention, the mounting surface comprises at least one spacer mounted to the mounting surface, and wherein the at least two elongated flexible extensions comprise at least two elongated flexible extensions having transverse projections, the transverse projections engagable with the at least one spacer.

The present invention addresses many of the limitations of the prior art including providing a secure support for the cabinet casters and seismic supports, providing recesses for the routing of electrical conduit, providing an easily accessible power input unit, and providing easily installable and removable trim pieces, that among, other things, provide a more pleasing appearance to the equipment cabinet. These and other embodiments and aspects of the present invention will become more apparent upon review of the attached drawings, description below, and attached claims.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following detailed descriptions of the preferred embodiments and the accompanying drawings in which:

FIG. 9 is a cross-sectional view of the aspect of the invention shown in FIG. 8A as viewed along lines 9—9 in FIG. 8A.

FIG. 9A is a detail view of the spacer shown in FIG. 9 according to one aspect of the invention.

DETAILED DESCRIPTION OF THE PREFERRED EMBODIMENTS

Figure 1:
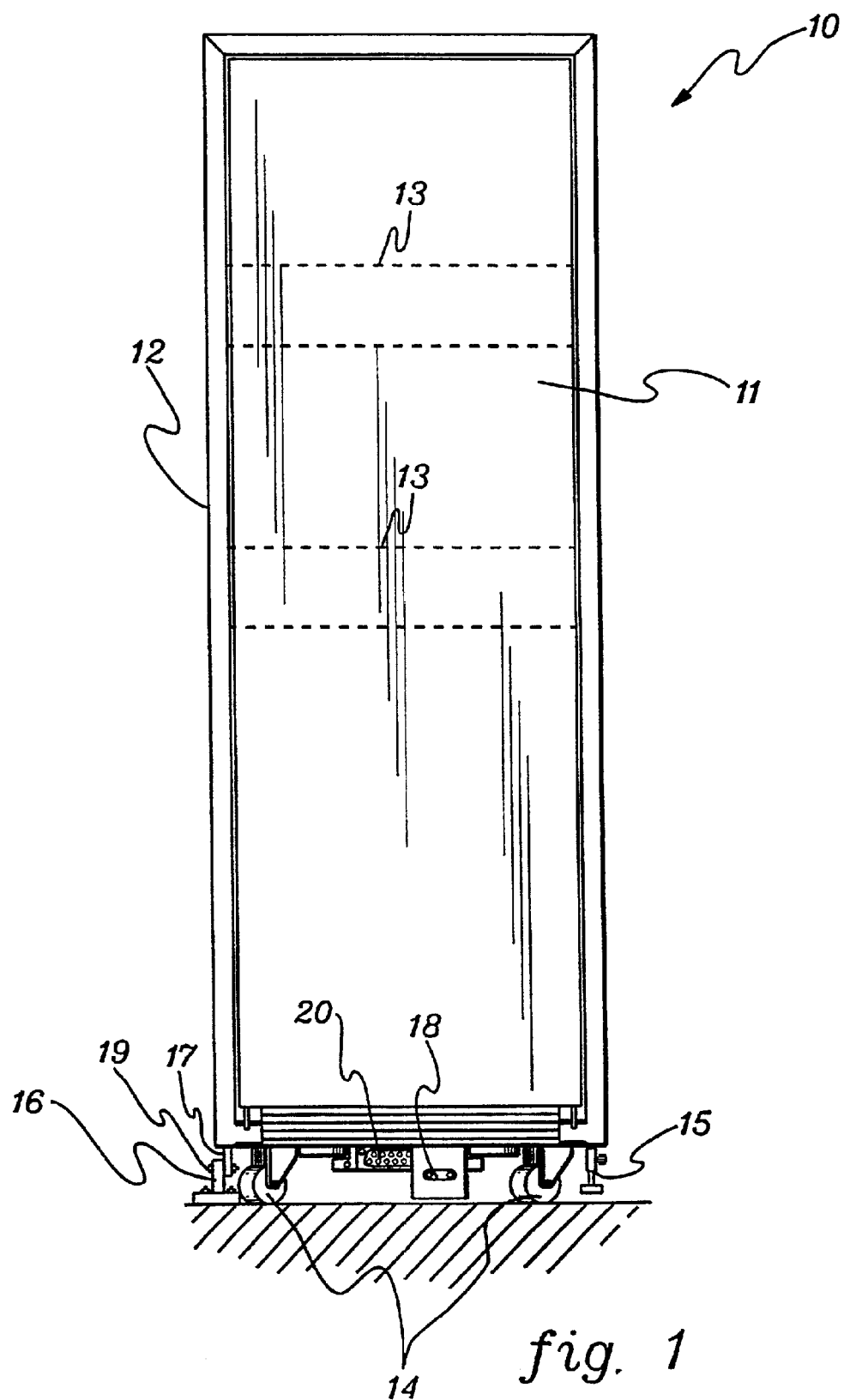
FIG. 1 is a front elevation view of an electronic equipment cabinet having one or more aspects of the present invention.

FIG. 1 illustrates a typical elevation view of a rack or cabinet 10 having one or more aspects of the present invention. Cabinet 10 includes a rectangular cylindrical frame 12 which provides the structural support for the electronic components 13 (shown in phantom) mounted in cabinet 10. Electronic components 13 may be computers, data storage devices, or communications devices, among others. Cabinet 10 also includes one or more panels 11, typically sheet metal or plastic panels, that are typically mounted to the top, bottom, and sides of frame 12 to protect the equipment within and to provide an aesthetically pleasing appearance to cabinet 10. Cabinet 10 of FIG. 1 also includes a set of casters 14, for example, four casters, that are used to install and remove cabinet 10. Though not clearly shown in FIG. 1, according to one aspect of the invention, casters 14 are not mounted to the sheet metal bottom (not shown) of cabinet 19 but casters 14 are rigidly mounted to the bottom support member of frame 12. Also shown in FIG. 1 is a typical seismic support 16. Seismic supports 16, which are conventional floor mountings, restrain cabinet 10 from moving or being toppled during a seismic event, that is, an earthquake. Though only a single seismic support 16 as shown in FIG. 1 may be used, it is understood by those of skill in the art that two or more such supports 16 may be used when mounting electronic equipment cabinets such as cabinet 10. As shown in FIG. 1, frame 12 of cabinet 10 may include a horizontal support (26 in FIG. 2) having a vertical projection 17 to which seismic support 16 can be mounted to frame 12, for example, by means of mechanical fasteners 19, for instance, threaded fasteners. Cabinet 10 may also include one or more leveling devices 15, for example, adjustable leveling devices, for supporting cabinet 10 at a desired installed elevation and orientation. One or more leveling devices 15 may be threaded devices, or wedge-type devices, or ball-and-ramp type leveling devices.

According to one aspect of the present invention, cabinet 10 may be transported to its desired installation location by means of casters 14. Then, when positioned as desired, leveling devices 15 may be adjusted to properly support cabinet 15 in its desired elevation, for example, relative to the flooring of the installation. This level adjustment may raise height of leveling devices 15 above the height of casters 14, for example, wherein casters 14 are lifted off the floor of the installation. When located at its desired elevation, cabinet 10 may be secured to seismic mount 16, for example, via mechanical fasteners, for instance, threaded fasteners.

According to one aspect of the invention, cabinet 10 also includes at least one power input device 18, for example, a power distribution unit (PDU). Unlike conventional cabinets, power input unit 18 of cabinet 10 is mounted below and outside frame 12 of cabinet 10 so that the unit can be easily accessed. Unit 18 is inserted into a power input port 20 of cabinet 10. As shown in FIG. 1, cabinet 10 includes at least two power input ports 20 for units 18, and only one such power input unit 18 is installed.

Figure 2:
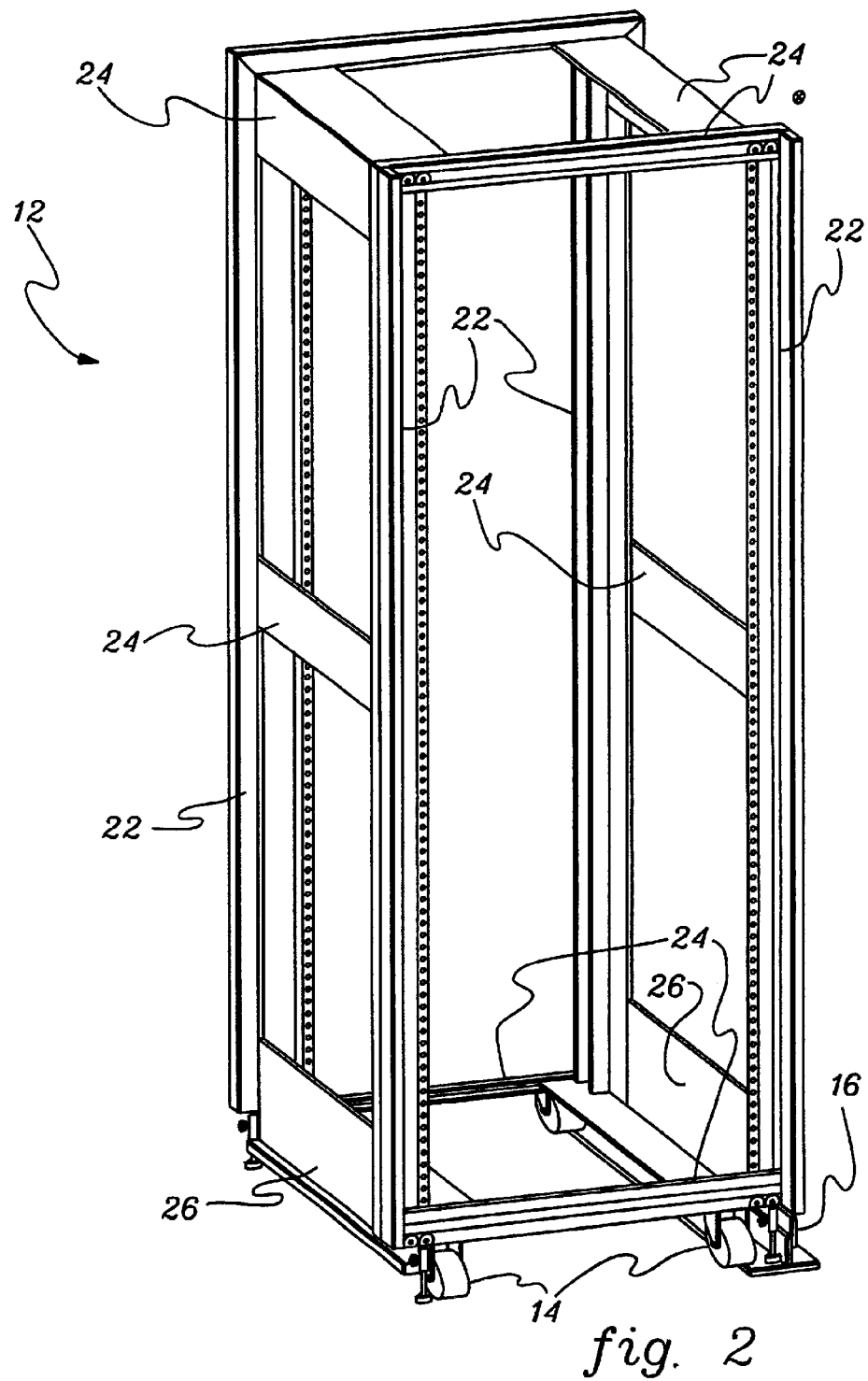
FIG. 2 is a perspective view of the structural frame and supports of the cabinet shown in FIG. 1.

FIG. 2 illustrates a perspective view of frame 12 of cabinet 10 shown in FIG. 1 with panels 11 removed. Frame 12 is typically comprised of extruded metal members, for example, extruded aluminum, formed into a cylindrical shape, for example, a rectangular cylindrical shape, though a circular cylindrical shape may also be used according to one aspect of the present invention. FIG. 2 also illustrates casters 14 and a seismic support 16 as shown in FIG. 1. As shown in FIG. 2, frame 12 typically includes a plurality, typically four, vertical support members 22 and a plurality of horizontal support members 24. According to another aspect of the present invention, FIG. 2 also illustrates a typical lower horizontal support 26 of frame 12. Among other things, support 26 provides a surface for mounting cabinet 10, for example, via casters 14 or seismic supports 16. Support 26 provides a stiffer, more rigid mounting of cabinet 10 than conventional cabinets. Conventional cabinets are typical mounted to a less rigid bottom panel which can be prone to undesirable deflection, for example, under seismic loading. Again, though only one seismic support 16 is illustrated in FIG. 2, it is understood by those in the art that two or more seismic supports 16 may be used.

Figure 3:
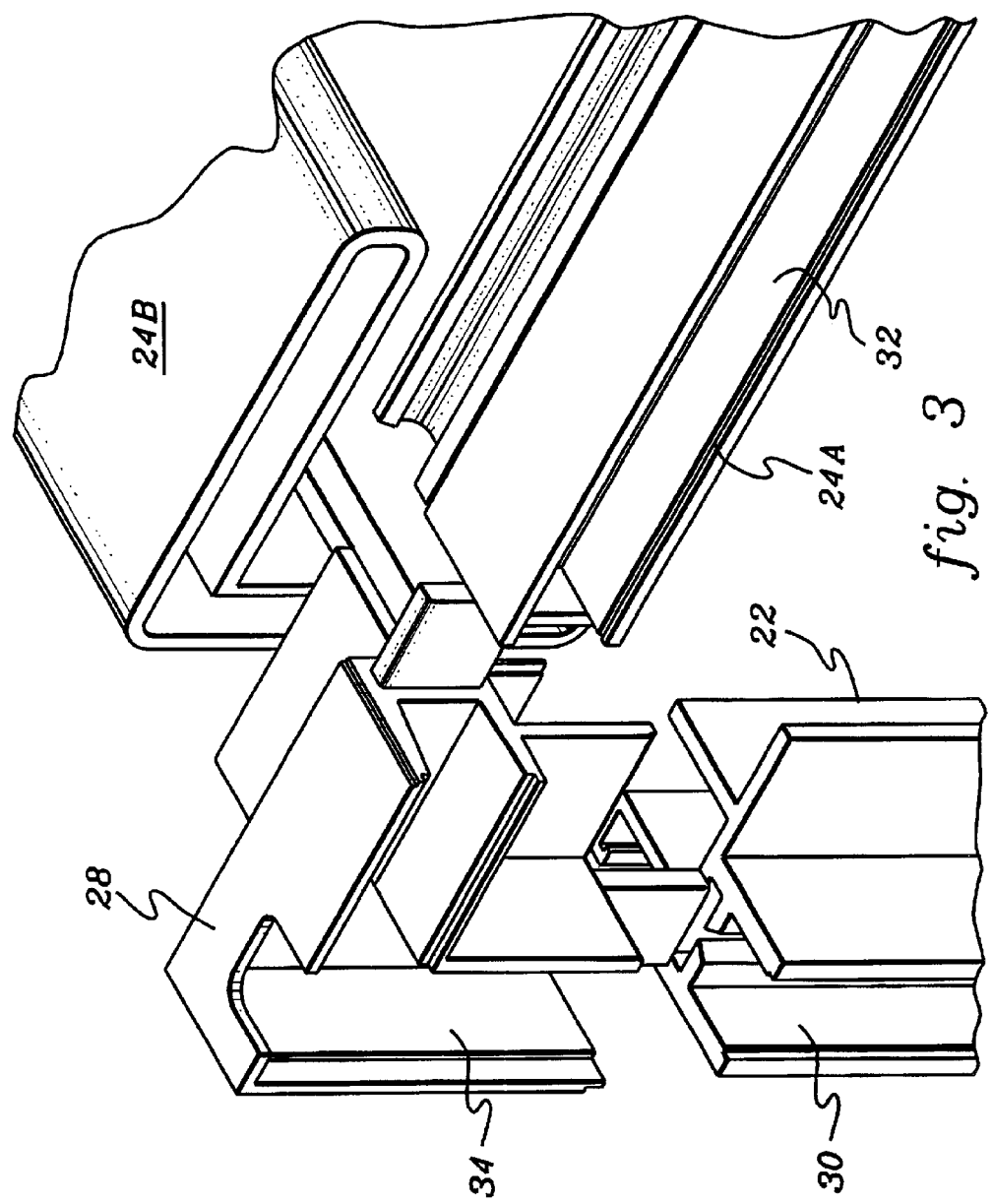
FIG. 3 is an exploded detailed view of one of the connections of the frame shown in FIG. 2.
Figure 4:
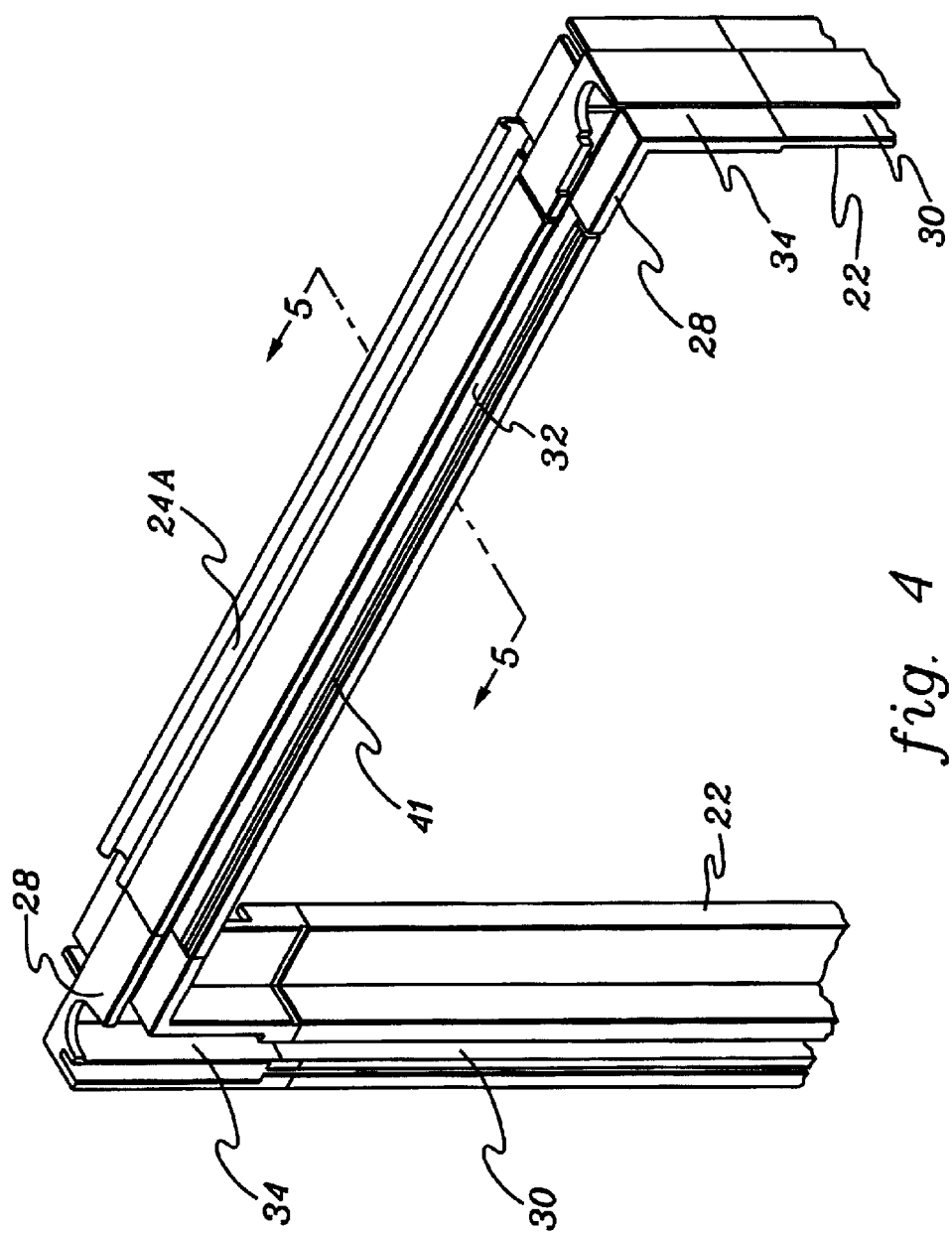
FIG. 4 is a detailed view of some of the structural members of the cabinet shown in FIG. 2.

FIG. 3 illustrates an exploded detail view of one of the support member connections of frame 12 shown in FIG. 2. Specifically, FIG. 3 illustrates the mechanical connection between two typically horizontal members 24A and 24B and typical vertical member 22 of frame 12. Though these members may be fastened by any conventional means, for example, mechanical fasteners, in the embodiment shown in FIG. 3, the members are secured by means of connector 28. Members 22, 24A, 24B, and connector 28 are typically made from extruded aluminum, though other materials may be used. Members 22, 24A, and 24B and connector 28 are typically secured to each other by welding, though mechanical fasteners or interference fits may be used. According to another aspect of the invention, at least one of members 22 and 24A include a recess or cavity 30, 32, respectively, in which electrical conduit may be inserted and routed as needed. Recesses 30, 32 are typically longitudinal recesses, that is, recesses that extend at least partially in the direction of elongation of members 22 and 24A. As shown in FIG. 3, connector 28 may also include a corresponding recess 34 which communicates with recesses 30 and 32 such that conduit can be routed from recess 30 through recess 34 to recess 32, or vice versa. As shown in FIG. 3, support members 22 and 24A, and connector 28, may include two recesses, or two or more recesses, for example, located on opposite sides of the members through which conduit may be routed. Thus, the support members 22 and 24A, in addition to providing structural support for the electronic components in cabinet 10, may also provide a pathway for routing conduit to and from the components 13 (see FIG. 1) mounted in cabinet 10. FIG. 4 illustrates a detailed view of the supports 22 and 24A and connector 28 of FIG. 3 when assembled. The recesses 30, 32, and 34 for electrical conduit that these elements provide when assembled are clearly illustrated in FIG. 4.

Figure 5:
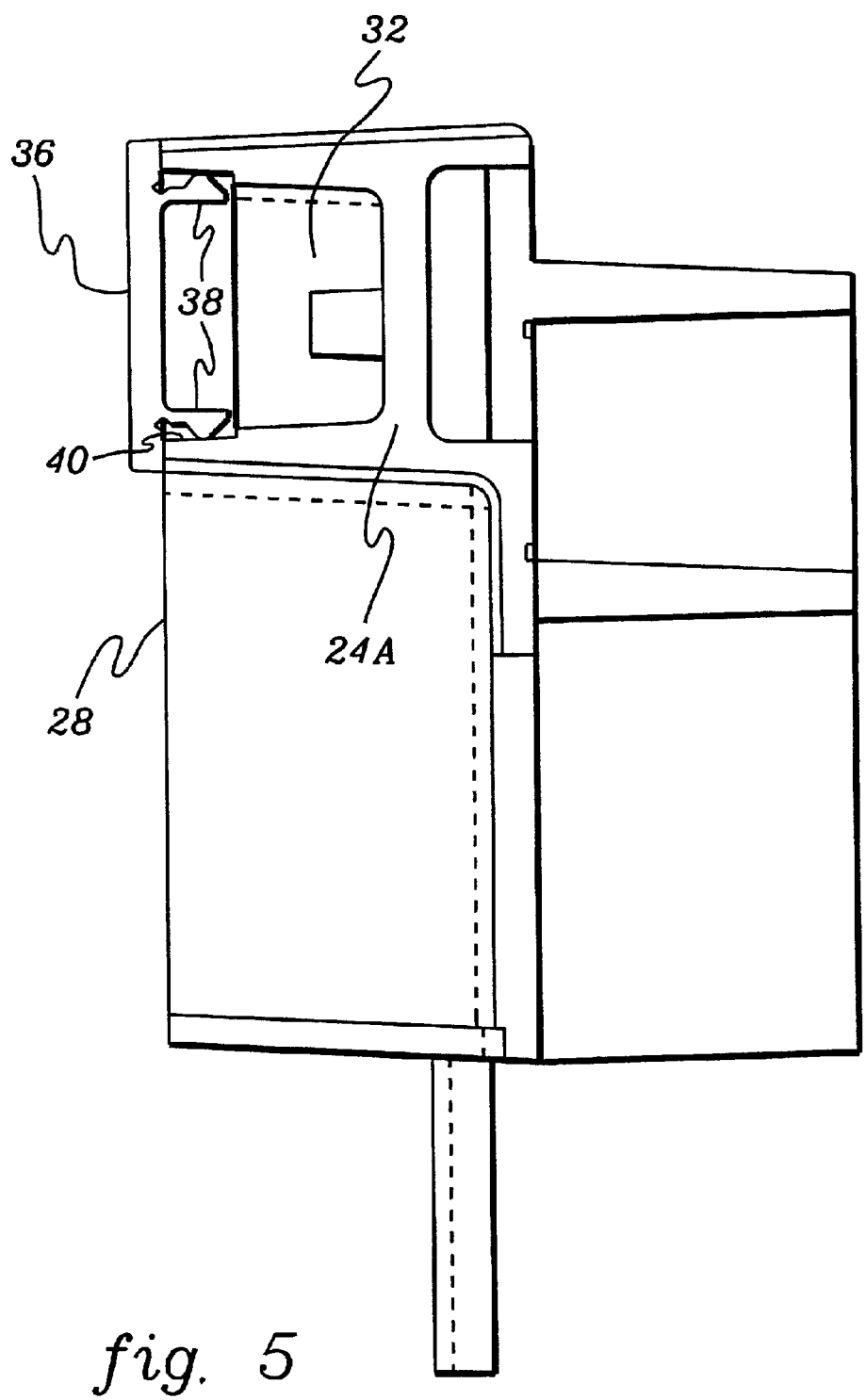
FIG. 5 is cross sectional view along the lines 5—5 shown in FIG. 4.

FIG. 5 is an axial view down the axis of member 24A as viewed along lines 5—5 in FIG. 4. FIG. 5 also illustrates the connector 28 and a cover 36 that can be affixed over recess 32 in member 24A. Cover 36 is typically a plastic cover having flexible extensions or tabs 38 that engage and are secured to the internal surface 40 of recess 30 in horizontal member 24A, for example, via cooperating indentations or projections 41 (not shown) in surface 40. For example, indentations or projections 41 may comprise notches or ribs, for instance, longitudinal notches or ribs, 41 as illustrated more clearly in FIG. 4.

Figure 6:
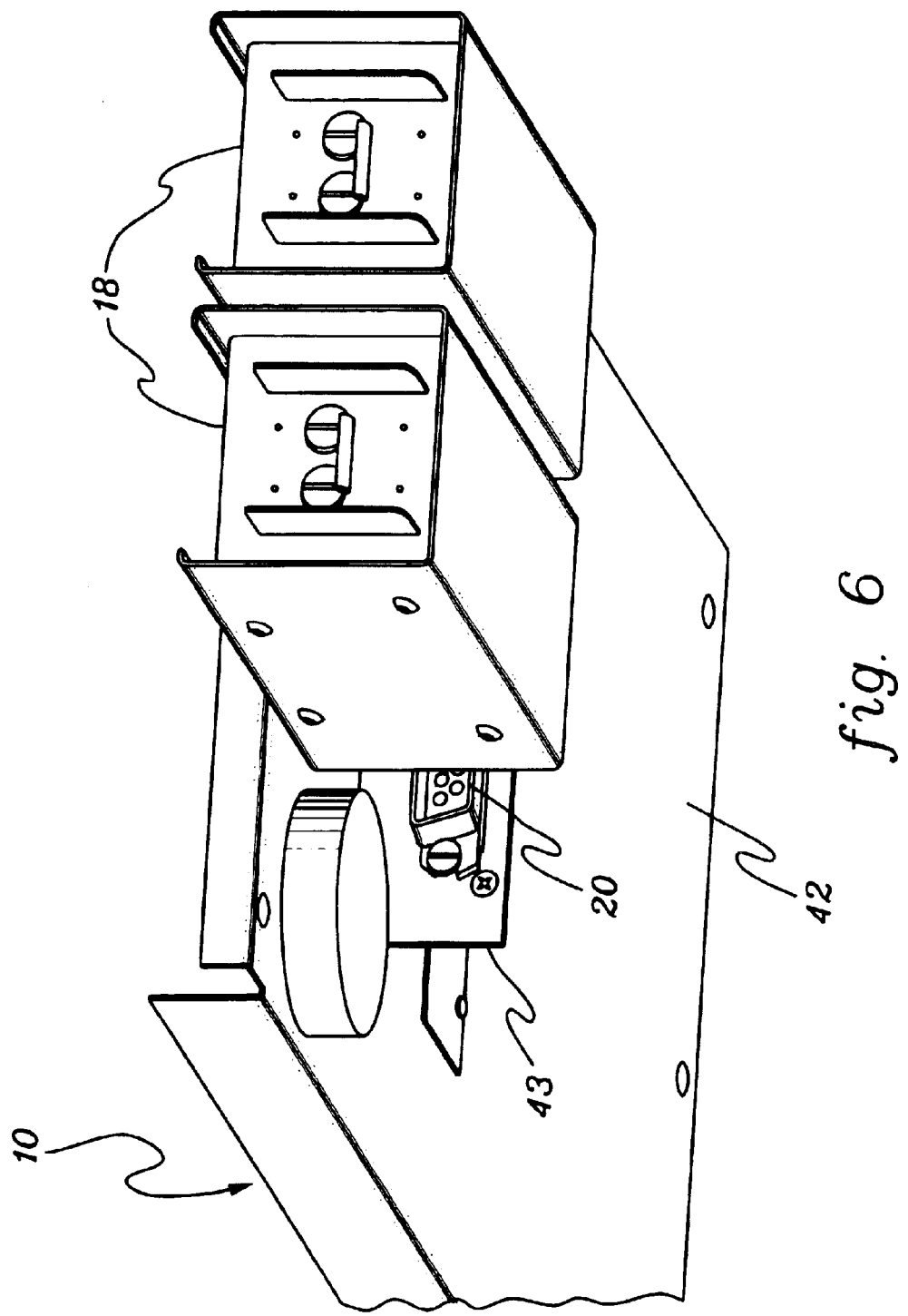
FIG. 6 is a detailed view of the power input unit mounting for the cabinet shown in FIG. 1.
Figure 7:
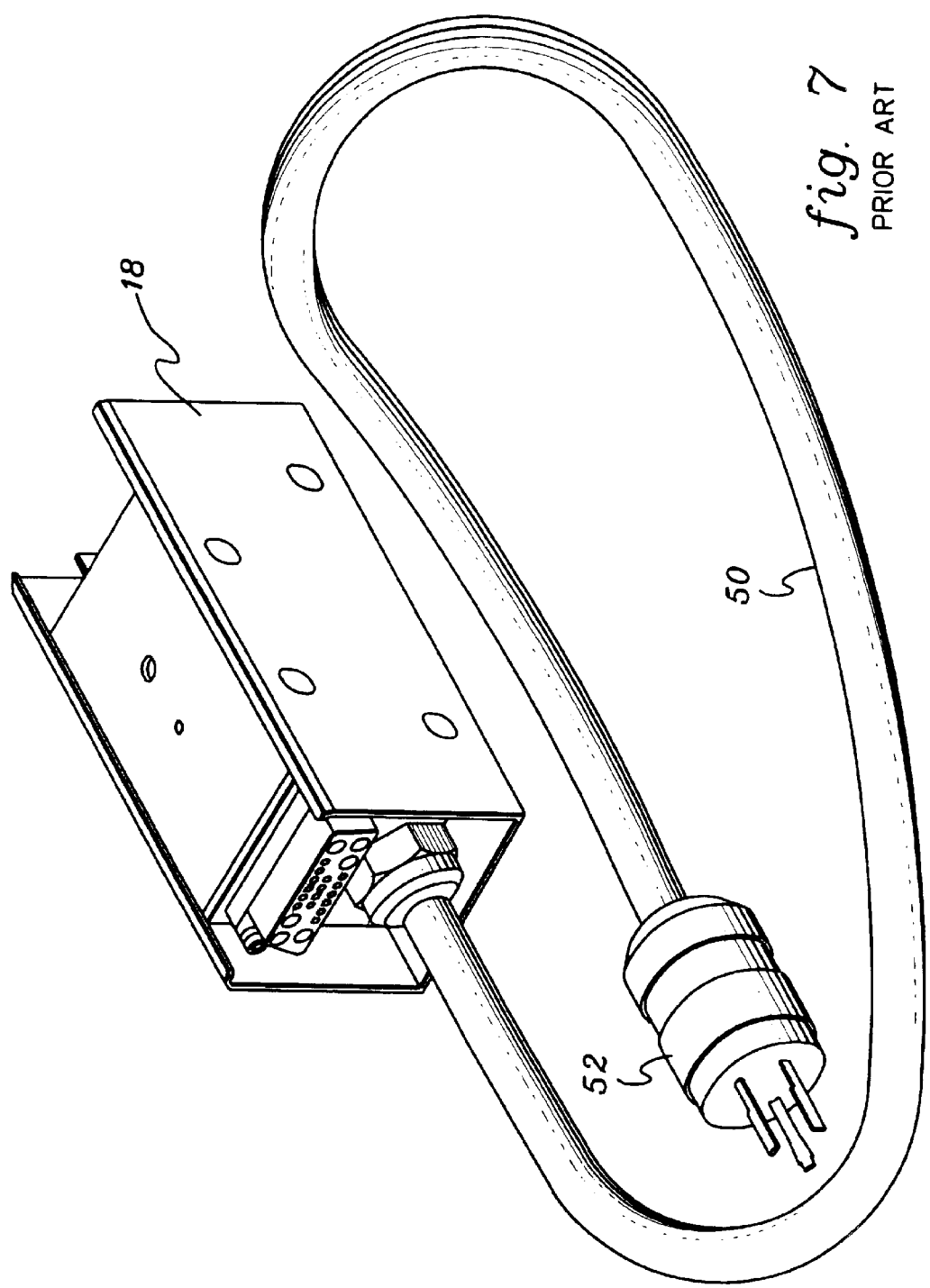
FIG. 7 is perspective view of one power input unit that can be used for the present invention.

FIG. 6 is a detailed view of the power input units 18 mounted in the base of cabinet 10 of FIG. 1. A typical power input unit 18 that may be used for the present invention is shown in FIG. 7. According to one aspect of the invention, power input unit 18 may be a power distribution unit, such as a PIM 24030 D power distribution unit (PDU) manufactured by Mack Molding of Arlington, Vt. though other types of units may be used. Power input unit 18 is installed in power input ports 20 mounted on mounting plate 43 in cabinet 10. Power input ports 20 may be any typical electrical connection, but in the aspect of the invention shown in FIGS. 6 and 7, power input ports 20 are 6-pin male connectors. As shown in FIG. 7, power input unit 18 receives electrical power via an electrical cable 50 having a electrical connector 52. Connector 52 can typically be plugged into a wall-mounted electrical outlet or other source of electrical power to supply power to cabinet 10 of FIG. 1.

FIG. 6 illustrates the sheet metal bottom plate 42 which is mounted to the bottom of frame 12 (not shown in FIG. 6). According to the present invention, plate 42 includes at least one power input port 20 mounted on mounting plate 43, though two such ports (one is hidden by units 18) are present in the aspect shown in FIG. 6, and at least one power input unit is installed into at least one port 20. Note that since power input units 18 are readily removable, they can be installed at any time before, during or after installation. Furthermore, since units 18 are located outside frame 12 and external to, for example, plate 42, units 18 are readily accessible for maintenance, service, or installation of electrical power. In addition, since unit 18 is located outside of frame 12 (see FIG. 1), unit 18 does not consume valuable space within the envelope of frame 12. According to this invention, one or more units 18 may be installed after installation, that is, it is not necessary to install unit 18 during fabrication or during transport of cabinet 10.

Figure 8A:
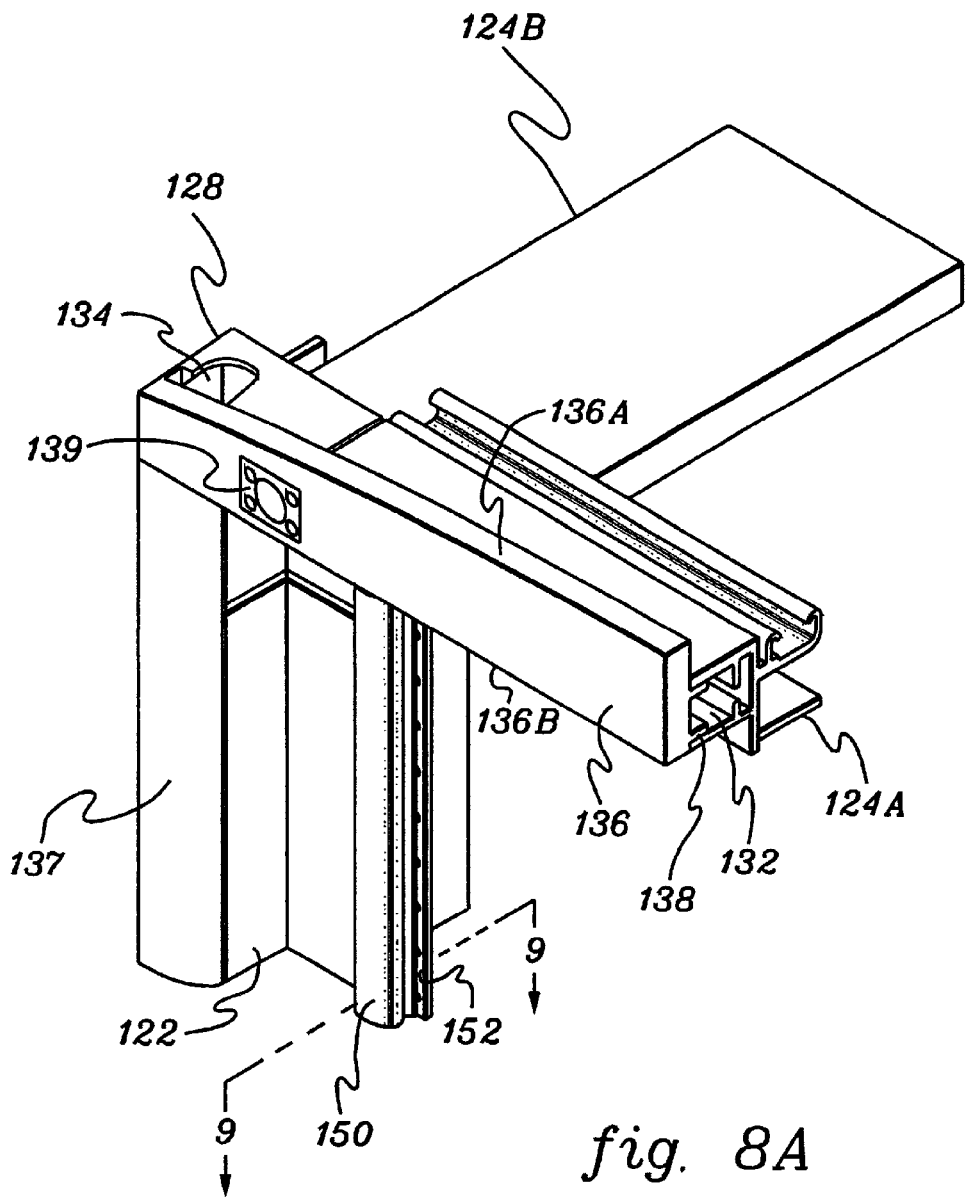
FIGS. 8A and 8B are perspective views of the mounting of trim pieces to an electronics cabinet according to another aspect of the present invention.
Figure 8B:
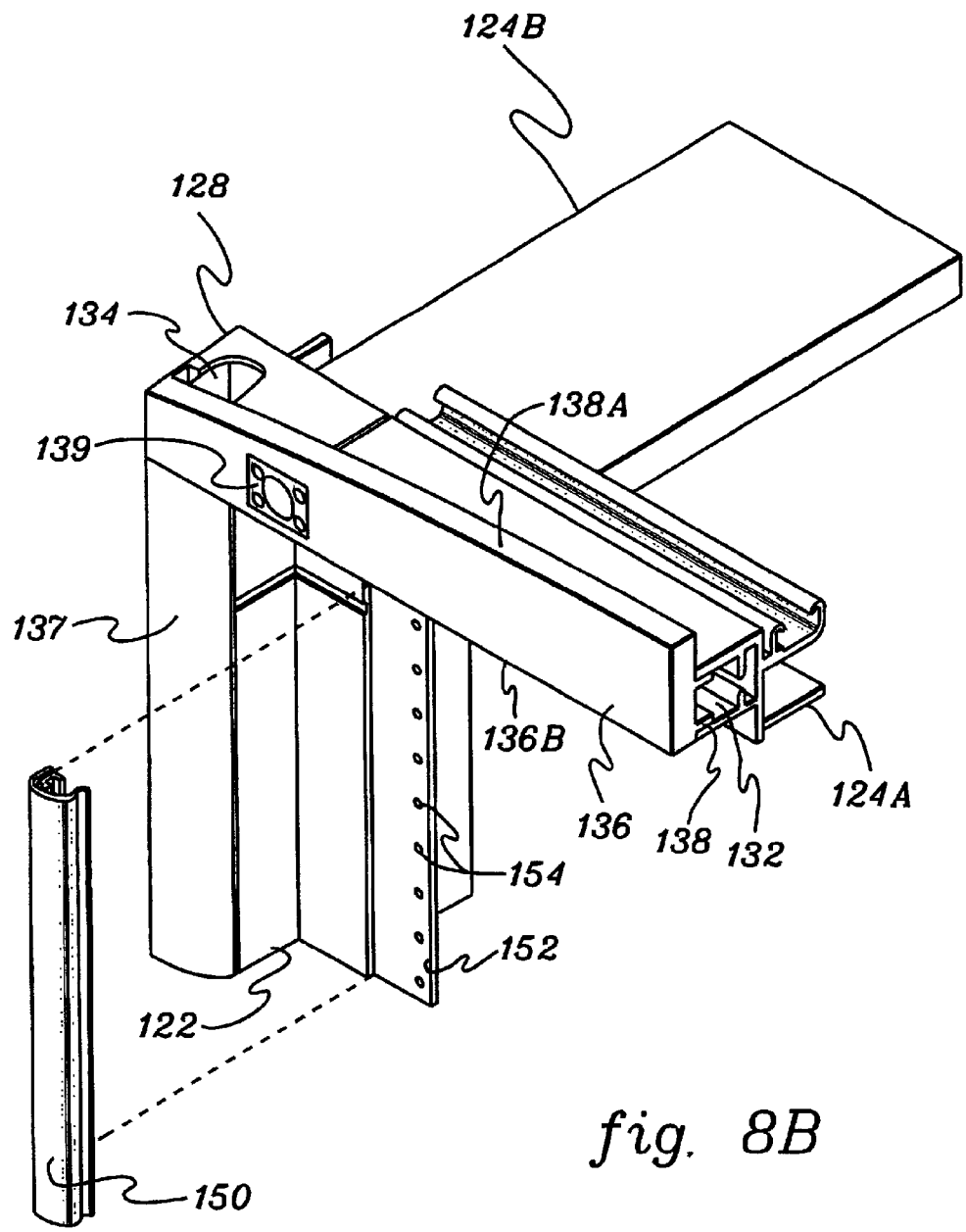

FIGS. 8A and 8B illustrate a further embodiment of the invention. FIGS. 8A and 8B are perspective views partially in cross-section similar to the perspective view shown in FIG. 3. FIG. 8A illustrates the mechanical connection between two horizontal members 124A and 124B, similar to members 24A and 24B in FIG. 3, and typical vertical member 122, similar to member 22 in FIG. 3. Members 124A, 124B, and 122 comprise members of an equipment rack frame, such as frame 12 in FIG. 2. As discussed earlier with respect to FIG. 3, members 124A, 124B, and 122 may be fastened by any conventional means, for example, mechanical fasteners. In the embodiment shown in FIG. 3, members 124A, 124B, and 122 are secured by means of connector 128. Again, members 122, 124A, 124B, and connector 128 are typically made from extruded aluminum, though other materials may be used. Members 122, 124A, and 124B and connector 128 are typically secured to each other by welding, though mechanical fasteners or interference fits may be used. In one aspect of the invention, members 122, 124A, and connector 128 include one or more recesses or cavities 130 (not shown), 132, and 134, respectively, in which electrical conduit may be inserted and routed as needed.

FIGS. 8A and 8B also illustrate recess cover pieces 136 and 137 which, according to one aspect of the invention, may be positioned over longitudinal recesses in support members 124A and 122, respectively. Cover pieces 136 and 137 may be similar to recess cover 36 shown in FIG. 5. Similar to cover 36, cover pieces 136 and 137 typically comprise a plastic cover having flexible tabs 138, similar to tabs 38 of cover 36, that engage and are secured to the internal surface recess 132 in horizontal member 124A, and the recess (not shown) in vertical member 122. Cover pieces 136 may have sides 136A and 136B which are essentially parallel to each other; however, in one aspect of the invention, sides 136A and 136 may be non-parallel, for example, as shown in FIGS. 8A and 8B, side 136A may have a curvilinear shape, for example, a parabolic shape. In one aspect of the invention, cover pieces 136 and 17 may include a power switch 139, for example, for shutting off electrical power to one or more components in rack 10.

According to the aspect of the invention shown in FIGS. 8A and 8B, vertical member 122 includes a trim piece 150 attached to vertical member 152. As shown more clearly in FIG. 8B where trim piece 150 is shown detached from vertical member 122, vertical member 122 (which may be similar to many vertical members in the art) typically includes a mounting strip 152 having mounting holes 154, for example, threaded mounting holes. Mounting strip 152 may be integral with vertical member 122 or may be removably mounted to vertical member 122, for example, by means of mechanical fasteners (not shown). Mounting strip 152 and mounting holes 154 are typically used in electronic cabinet design to mount electrical equipment in a cabinet, for example, by means of mechanical fasteners, for instance, mounting screws (not shown). According to one aspect of the present invention, trim piece 150 is mounted to mounting strip 152 to cover mounting strip 152 and conceal mounting holes 154 and any fasteners inserted into mounting holes 154. Trim piece 150 is typically made from a plastic material, for example, a polyvinyl chloride (PVC)-type plastic, a polystyrene-type plastic, or their equivalents. In one aspect of the invention, trim piece 150 is attached to mounting holes 154 by means of a "snap on" fit, for example, by means of flexible projections (not shown) which project into and engage one or more mounting holes 154 to retain trim piece 150 on mounting strip 152. In one aspect of the invention, trim piece 152 comprises one or more, trim pieces 152, which may extend partially or completely along the length of vertical member 122, for example, extend over essentially the entire height of cabinet 10.

A detail of one aspect of the invention shown in FIGS. 8A and 8B is shown in FIG. 9. FIG. 9 illustrates a cross-sectional view of trim piece 150 and mounting strip 152 as viewed along lines 9—9 shown in FIG. 8A. As shown in FIG. 9, mounting strip 152 may be L-shaped having one leg 152A mounted to vertical member 122 (not shown in FIG. 9) and one leg 152B having mounting holes 154. As shown in FIG. 9, according to one aspect of the invention, trim strip 150 is mounted to mounting strip 152 by means of at least one stand-off spacer 156, typically, a plurality of spacers 156. Spacers 156 are mounted to mounting strip 152, for example, via mounting holes 154, and one or more trim pieces 150 are mounted to spacers 156. In one aspect of the invention, spacers 156 are metallic, for example, steel, stainless steel, or aluminum, but in another aspect of the invention spaces 156 may be non-metallic, for example, a plastic. Spacers 156 may be mounted to mounting strip 152 by any conventional means, for example, snap-fit, by adhesives, or even by welding or brazing, but in one aspect of the invention, spacers 156 are threaded, for example, threaded on one end 158, and spacers 156 are mounted to mounting strip 152 by screwing end 158 into complementary threaded holes 154 in mounting strip 152.

FIG. 9A illustrates a detailed view of spacer 156. In one aspect of the invention, spacer 156 comprises a cylindrical main section 160, for example, circular cylindrical or rectangular cylindrical, having a recess, slot, or gap 162. When main section 160 is circular cylindrical, recess 162 may be an annular slot at least partially encircling body section 160. When main section 160 is rectangular cylindrical, recess 162 may be a longitudinal or lateral recess or slot on the side of body section 160. According to one aspect of the invention, spacer 156 has a height H of between about 0.30 inches and about 0.80 inches; a width or diameter W of between about 0.30 inches and about 0.60 inches; and an inner width or diameter w of between about 0.15 inches and about 0.25 inches. In one aspect of the invention, when the main section 160 is rectangular cylindrical in shape, the length of main section 160 may be about equal to the width W of main section 160, however, the length of main section 160 may be longer than width W, for example, twice or three times or more as long as width W.

According to the aspect of the invention shown in FIG. 9, trim piece 150 includes extensions 164 having projections 166, for example, transverse projections 166, which engage slots 162 in spacer 156. In one aspect of the invention, extensions 164 are elongated extensions which extend at least partially along the length of trim piece 150. In one aspect of the invention, extensions 164 extend along the entire length of trim pieces 150. In another aspect of the invention, extensions 164 are annular extensions and at least partially encircle, or completely encircle, circular cylindrical main section 160 of spacer 156. In one aspect of the invention, extensions 164 define a cavity in trim piece 150 having a bottom 168 which contacts spacer 156. Extensions 164 are preferably flexible and radially or laterally deflect outward when trim piece 150 is compressed against one or more spacers 156 and then radially or laterally deflect inward wherein projections 166 engage recesses 162 to retain trim piece 150.

The outer surface 170 of trim piece 150, which may be exposed to view, may be colored, decorated, or contoured to provide a pleasing appearance to trim piece 150. Trim piece 150 may also include a side extension 172 to further conceal mounting strip 152 and also conceal spacers 156 and extensions 164 from view.

According to one aspect of the present invention, first, one or more, typically a plurality, of spacers 156 are threaded into threaded holes 154 in mounting strip 152. Then, one or more trim pieces 150 are positioned above spacers 156 and compressed against spacers 156 wherein extensions 164 and projections 166 first deflect and then engage recesses 162 in spacers 156. Trim piece 150 can simply be removed by pulling on trim piece 150 wherein extensions 164 again deflect and projections 166 disengage recesses 162. According to one aspect of the invention, trim pieces 150 may be repeatedly attached and removed as needed.

According to another aspect of the invention, trim pieces 150 can be engaged to spacers 156 with little or no deflection of extensions 164. In this embodiment of the invention, one or more trim pieces 150 are engaged to spacers 156 by positioning an end of one trim piece 150 so that projections 166 engage recesses 162 and then slidably engaging projections 166 into recesses 162 in one or more spacers 156.

In this aspect of the invention, trim pieces 150 are preferably made from a flexible material, for example, sheet metal or plastic, to facilitate engaging projections 166 in slots 164 and sliding one or more trim pieces 150 to engage further spacers 156 to attach one or more trim pieces 150 to mounting strip 152.

The aspects of the present invention provide numerous advantages over prior art electronic equipment racks. In one aspect of the invention, an equipment rack is provided that provides a more rigid support for mounting hardware, such as casters and seismic supports, than is provided by prior art racks by mounting this hardware directly to the cabinet frame. Another aspect of the invention, facilitates the routing of wires and cables by providing cable routing paths in the horizontal and vertical members of the frame of the rack. Another aspect of the invention, improves the accessibility of power input modules while reducing the impact of the modules on the space within the rack. Still another aspect of the present invention provides easily attachable trim pieces which conceal unsightly mounting holes in the rack.

While the invention has been particularly shown and described with reference to preferred embodiment, it will be understood by those skilled in the art that various changes in form and details may be made to the invention without departing from the spirit and scope of the invention described in the following claims.

What is claimed is:

1. A cabinet for mounting electronic equipment comprising a cylindrical frame having a top, bottom, and sides, the frame defining an internal cavity, and at least one power input unit for supplying power to at least some of the electronic equipment, wherein the at least one power input unit is mounted outside of the internal cavity.

wherein the cabinet further comprises a bottom panel, and wherein the power input unit is mounted below the bottom panel, and wherein the cabinet further comprises a vertical mounting plate mounted beneath the bottom panel and at least one power input port mounted to the vertical mounting plate, and wherein the power input unit is installed in the at least one power input port.

2. The cabinet as recited in claim 1, wherein the at least one power input unit comprises at least one power input unit having power conditioning.

3. The cabinet as recited in claim 1, wherein the power input unit comprises a power distribution unit.

4. An arrangement for introducing electrical power to an electronic equipment cabinet, the electronic equipment cabinet comprising a cylindrical frame having a top and a bottom, the frame defining an internal cavity, the arrangement comprising:

a mounting plate positioned below the bottom of the frame and outside the internal cavity of the frame;

at least one power input port mounted to the mounting plate; and at least one power input unit mounted to the at least one power input port.

5. The arrangement as recited in claim 4 wherein the power input unit comprises a power distribution unit.

6. The arrangement as recited in claim 4 wherein the cabinet further comprises a bottom panel, and wherein the mounting plate comprises a vertical plate mounted to the bottom panel.

7. The arrangement as recited in claim 4 wherein the at least one power input port comprises at least one multi-pin input port.

8. The arrangement as recited in claim 7, wherein the multi-pin power input port comprises one of a male and a female multi-pin power input port.

9. The arrangement as recited in claim 4 wherein the power input unit comprises a power cord interface and a power output port, wherein the power cord interface and power output port are positioned on the same side of the power input unit.

* * * * *